United States Patent
Sugihara et al.

(10) Patent No.: US 6,417,540 B1
(45) Date of Patent: Jul. 9, 2002

(54) NON-VOLATILE SEMICONDUCTOR MEMORY DEVICE AND METHOD FOR MANUFACTURING THE SAME

(75) Inventors: Tsuyoshi Sugihara; Satoshi Shimizu; Takahiro Onakado, all of Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/630,018

(22) Filed: Jul. 31, 2000

(30) Foreign Application Priority Data

Feb. 17, 2000 (JP) ........................... 2000-039678

(51) Int. Cl.$^7$ ............................... H01L 29/788
(52) U.S. Cl. ........................ 257/316; 438/259
(58) Field of Search ................. 257/316, 318; 438/259

(56) References Cited

U.S. PATENT DOCUMENTS

| | | | | |
|---|---|---|---|---|
| 4,679,304 A | * | 7/1987 | Bois ........................... | 438/426 |
| 4,713,677 A | * | 12/1987 | Tigelaar et al. ............. | 257/321 |
| 5,051,795 A | * | 9/1991 | Gill et al. .................... | 257/317 |
| 5,159,431 A | * | 10/1992 | Yoshikawa ................... | 257/316 |
| 5,451,803 A | * | 9/1995 | Oji et al. ..................... | 257/316 |
| 5,498,891 A | * | 3/1996 | Sato ............................. | 257/316 |
| 5,932,920 A | | 8/1999 | Kim et al. ................... | 257/395 |
| 6,180,490 B1 | * | 1/2001 | Vassiliev et al. ............ | 438/424 |

FOREIGN PATENT DOCUMENTS

JP         8-288477        11/1996

OTHER PUBLICATIONS

Wolf, *Silicon Processing for the VLSI Era—vol. 2: Process Integration*, (Lattice Press, CA, 1990), pp. 28–31.*

* cited by examiner

Primary Examiner—Amir Zarabian
Assistant Examiner—Christian D. Wilson
(74) Attorney, Agent, or Firm—McDermott, Will & Emery

(57) ABSTRACT

The present invention relates to a non-volatile semiconductor memory device, having the higher margin of the implanted ion passing through a source-to-drain electrode, as well as the excellent covering power of an embedded layer deposited in and above a groove within a field oxide region distributed at both the source-to-drain electrode and a source area.

The present invention also provides a method for manufacturing the non-volatile semiconductor memory device.

6 Claims, 6 Drawing Sheets

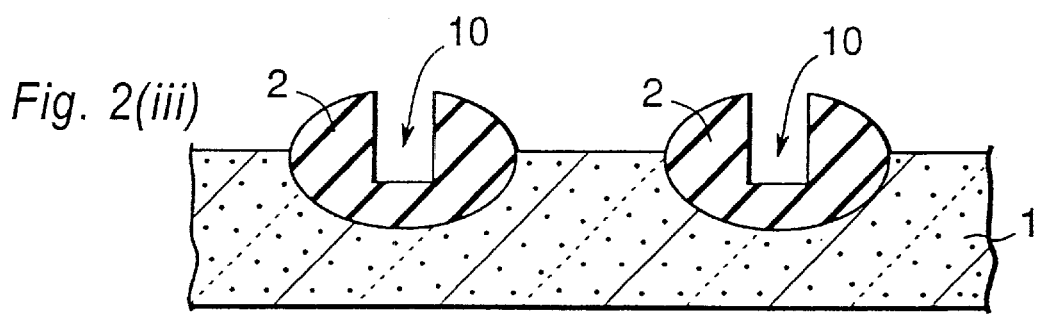
Fig. 2(iii)

Fig. 7(iii)
(PRIOR ART)
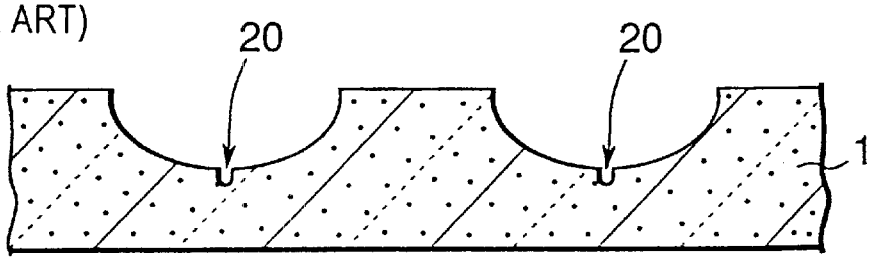

NON-VOLATILE SEMICONDUCTOR MEMORY DEVICE AND METHOD FOR MANUFACTURING THE SAME

FIELD OF THE INVENTION

The present invention relates to a non-volatile semiconductor memory device, having an enhanced margin of the implanted ion passing through an electrode, and excellent covering power (that is, surface smoothness) of an embedded layer deposited in a groove within a field oxide region distributed at both a memory cell area and a peripheral circuit area. The present invention also relates to a method for manufacturing the same.

BACKGROUND OF THE INVENTION

A memory device retaining memories recorded therein after its electric power is switched off is generally called a non-volatile semiconductor memory device, including, for example, a ROM (Read Only Memory) and a PROM (Programmable ROM) and the like. The ROM does not allow a user to write another data therein, in addition to the data which had been written by a manufacturer. On the other hand, the PROM permits a user to write another data. The PROM generally classifies into three types: one in which the data is rewritten only once; an EPROM (Electrically Programmable ROM) in which the data is possible to erase by exposing to ultraviolet light and to further rewrite them any number of times; and an EEPROM (Electrically Erasable and Programmable ROM) in which the data is possible to erase by supplying with an electric signal and to further rewrite them any number of times. For the EEPROM, the erasion may be conducted by applying a high-voltage signal between its control gates.

The non-volatile semiconductor memory device generally includes a cell array region containing a memory cell area, and a peripheral circuit region distributed around the cell array region. The memory cell area in the cell array region comprises a floating gate for storing the data and a control gate for controlling the floating gate.

In general, the non-volatile semiconductor memory device is manufactured by a conventional method including steps as shown in FIGS. 5 and 6, as explained as follows:

(1) First, a field oxide region 2 is formed in a recess on a surface of a semiconductor substrate 1, and then a first insulator layer 61 is deposited over the whole substrate 1 (FIG. 5 (1)).

(2) A film-forming material for a floating gate is deposited over the whole substrate 1 and subjected to any lithographic processes to form a floating gate 4 (FIG. 5 (2)).

(3) An interlaminar insulator layer 62 for separating the floating gate from a control gate 5 (as explained hereinafter) is formed on the whole substrate 1 containing the floating gate 4, and subsequently covered with a material for forming a control gate 5 (FIG. 5 (3)).

(4) A control gate 6 is formed by any lithographic processes before the film-forming material for the floating gate 4 remaining between the control gates 6 is removed to form a groove 10 in the field oxide region 2 between the floating gates 4 (that is, between the control gates 6) (FIG. 6).

After the step (4), the following procedures are continued to form an electrode.

(5) On the whole substrate, tetraethylorthosilicate (abbreviated as TEOS) is generally deposited as an embedded layer 3 (FIG. 7 (i)).

(6) The embedded layer 3 is then etched back (FIG. 7 (ii)).

(7) An ion implantation into an electrode is conducted.

(8) Both the embedded layer 3 and field oxide region 2 remaining at a source area are etched to perfectly remove (FIG. 7 (iii)). An etching rate is determined by defining as an endpoint a time taken to perfectly remove the thickest parts of both the embedded layer and the field oxide region. After the etching step, ion implanting is conducted.

In general, an interlayer is then deposited on the resulting electrode after the ion implanting.

However, the embedded layer deposited on the electrode in the above way was adversely affected by an asperity of a surface of an underlayer. For example, the embedded layer bulged at a convex part of the underlayer, such as a part around a top of an inwall of the groove 10 and the like, and it was significantly concave at a fallen part of the underlayer, such as a part above an opening of the groove 10, as shown in FIG. 7 (i). Thus, the embedded layer significantly resulted in the poor surface smoothness.

Therefore, after the step (6) in the conventional method, the embedded layer 3 generally remains in an extremely thin form at a center of the groove, or a part of the bottom of the groove uncovered with the embedded layer 3 was optionally exposed, as shown in FIG. 7 (ii). When the remaining embedded layer 3 was optionally subjected to the etching step (8) as explained above to perfectly remove, the part of the substrate 1 which was not covered with the embedded layer 3 would be overetched, as shown by number 20 in FIG. 7 (iii). In the conventional semiconductor memory device, when some problems such as the increased electric resistance and the like occurred, the overetched area 20 was generated on the surface of the substrate.

Alternatively, when the memory area or the source area is formed, the embedded layer and the field oxide region remains with neither ion implanting nor etching (as explained in the above steps (6) and (7)) after the above step (5), and then they are further covered with the interlayer. However, since the residual embedded layer and the field oxide region had the asperity on their surface as explained above, the interlayer further deposited thereon also resulted in the poor surface smoothness (that is, the poor covering power).

Accordingly, one purpose of the present invention is to overcome the above problems and to enhance a margin of implanted ion passing through the electrode, as well as to improve the covering power (the surface smoothness) of the interlayer further deposited in and above the groove formed within the field oxide region distributed at both the memory cell area and the peripheral circuit area.

SUMMARY OF THE INVENTION

Accordingly, the present invention provides a non-volatile semiconductor memory device, comprising a semiconductor substrate having a recess pattern on a surface thereof, a field oxide region formed in the recess pattern, and on the surface of the semiconductor substrate, a first insulator layer, a floating gate-electrode layer, a second insulator layer and a control gate-electrode layer which are deposited after the formation of the field oxide region, wherein the floating gate-electrode layer is formed adjacent to the field oxide region having a groove therein, followed by depositing an embedded layer over the whole surface of the semiconductor substrate, including the groove, and then etching back, characterized by that a width (w) at the bottom of the groove is adjusted to be at most twice larger than a distance (t) between the lowest level of the surface of the embedded layer in the groove and each end of the bottom of the groove.

For the non-volatile semiconductor memory device of the present invention, the embedded layer is deposited over the whole surface of the semiconductor substrate, including the groove, and remains in and above the groove even after the etching-back. The embedded layer may be deposited in and above the groove, more preferably up to the same level as a top of the inwall of the groove. Particularly, the inwall of the groove tilts so as to have a wider width between the top of the inwall of the groove than the width of the bottom of the groove.

An example of a suitable material for forming the embedded layer in the non-volatile semiconductor memory device of the present invention may be selected from the group consisting of high density plasma CVD film (abbreviated as HDP, hereinafter), both boron and phosphorous-doped tetraethyl orthosilicate (abbreviated as BPTEOS), boron-doped tetraethyl orthosilicate (abbreviated as BTEOS) and phosphorous-doped tetraethyl orthosilicate (abbreviated as PTEOS).

Alternatively, the present invention further provides a method for manufacturing the non-volatile semiconductor memory device, comprising steps of providing a recess pattern on a surface of a semiconductor substrate to form a field oxide region in the recess pattern, depositing a first insulator layer and a floating gate-electrode layer on the surface of a semiconductor substrate and etching them to form a floating gate, depositing a second insulator layer and a control gate-electrode layer over the whole surface of the semiconductor substrate and etching them to form a control gate, and then removing the residual floating gate-electrode layer on an electrode region to form a groove in the field oxide region, further comprising a step of depositing an embedded layer over the whole surface of the semiconductor substrate, including the groove, followed by etching back to be a width (w) at the bottom of the groove at most twice larger than a distance (t) between the lowest level of the surface of the embedded layer in the groove and each end of the bottom of the groove, characterized by that the step of etching a memory cell in a cell array region is conducted apart from the process for a peripheral circuit region distributed around the cell array region, where does not essentially need the etching step.

DETAILED DESCRIPTION OF THE PREFERRED EMBODIMENTS

Non-volatile Semiconductor Memory Device

Embodiment 1

A non-volatile semiconductor memory device as Embodiment 1 of the present invention contains a semiconductor substrate 1 having a recess, and a field oxide region 2 formed in the recess, and a floating gate-electrode layer on the whole surface of the substrate 1, wherein the floating gate-electrode layer is deposited adjacent to the field oxide region. At an electrode region, a groove 10 is formed in the residual field oxide region 2 in removing the floating gate-electrode layer after the formation of a floating gate, followed by depositing an embedded layer 3 on the whole surface of the substrate 1, including the groove 10.

Figure 5:
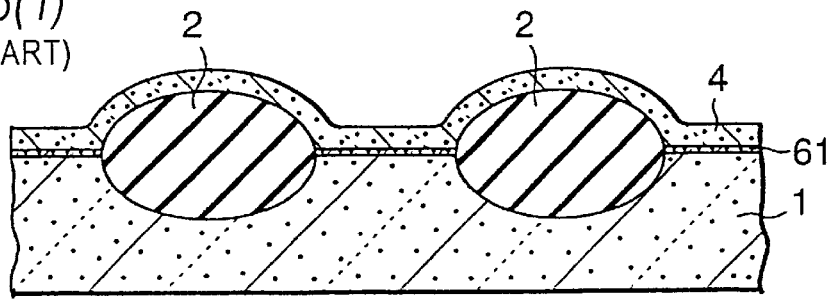
FIG. 5 shows a process flowchart, illustrating steps for depositing interlayers 4, 5, 61 and 62 over the whole surface of a semiconductor substrate 1, including a groove 10 within a field oxide region 2, to form a floating gate and a control gate by the conventional method.
Figure 5:
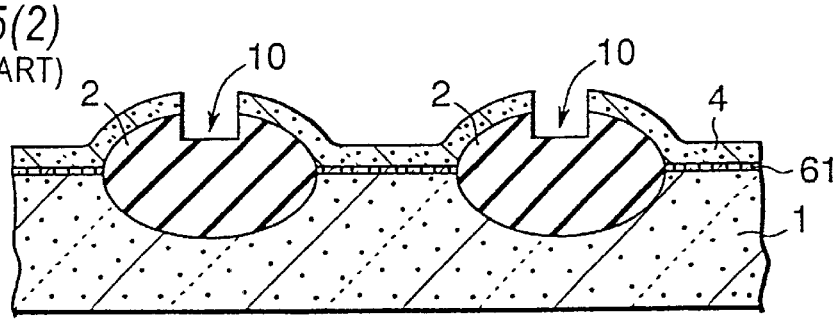
Figure 5:
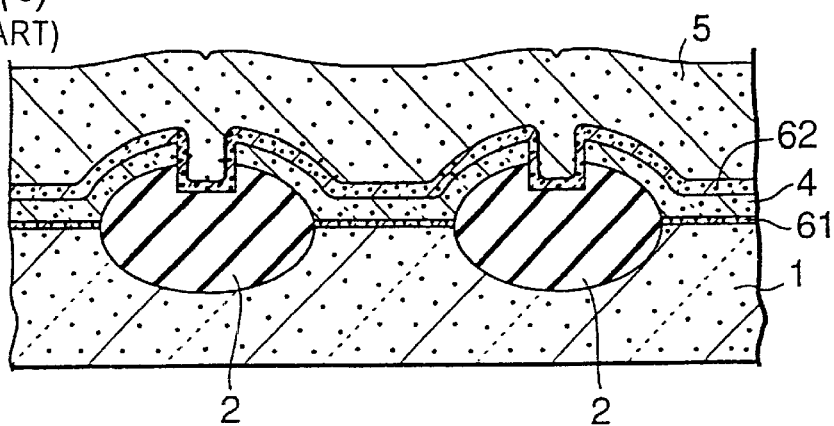
Figure 6:
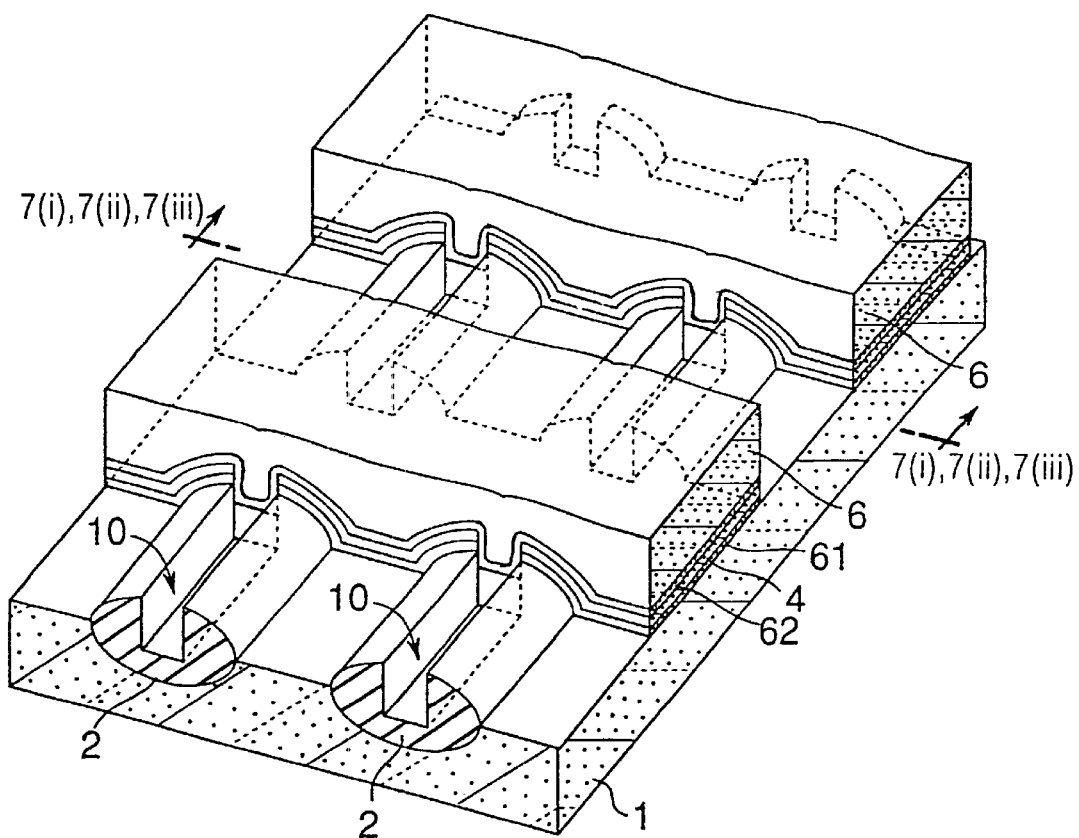
FIG. 6 shows a bird's-eye view of the non-volatile semiconductor memory device produced by the conventional method.

Then, the field oxide region 2 may be formed by the conventional method explained hereinbefore, as shown in, for example, FIG. 5. In the non-volatile semiconductor memory device, the field oxide region 2 is generally used for separating a memory cell formed in a cell array region from a peripheral circuit region distributed around the cell array region.

In the non-volatile semiconductor memory device of the present invention, the groove in the field oxide region, and the embedded layer over the whole surface of the substrate, including the groove, may be formed according to the conventional method mentioned above. After the formation, the embedded layer is etched back.

Figure 1A:
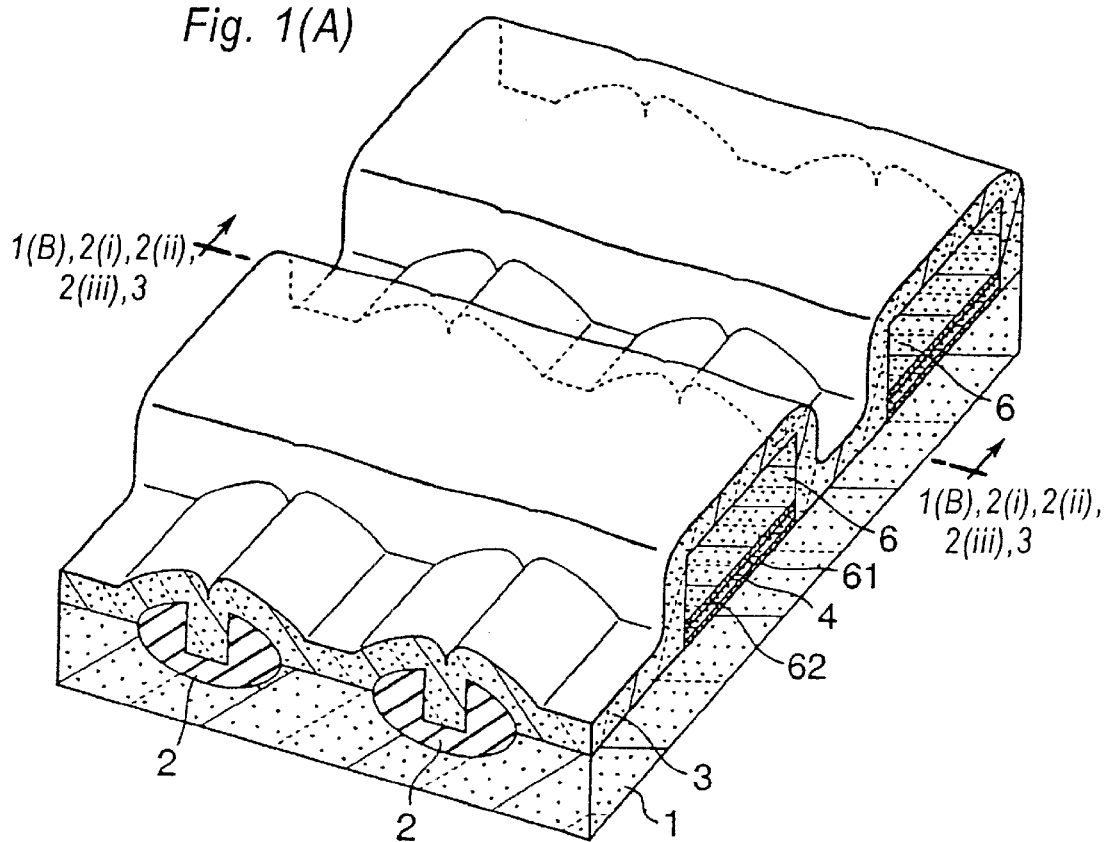
FIG. 1 schematically shows a bird's-eye view (A) illustrating Embodiment 1 of the non-volatile semiconductor memory device according to the present invention, and a cross sectional view (B) along a line A-B in the view (A).
Figure 1B:
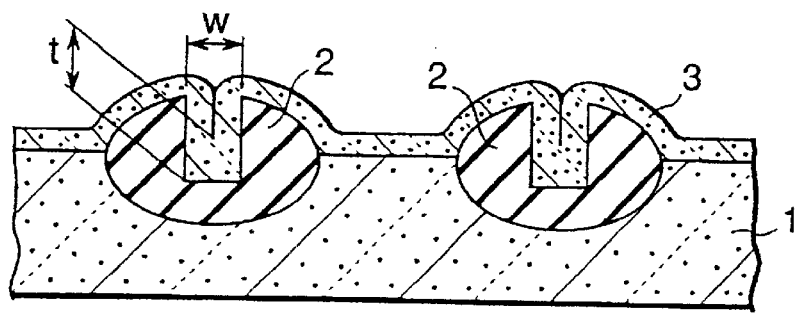

The non-volatile semiconductor memory device of the present invention is characterized by that a ratio of a width (w) of a bottom of the groove 10 within the field oxide region 3 distributed between the elements in the memory cell, and a thickness (t) of the residual embedded layer 3 from the inwall of the groove 10 after the etching-back step is lower than the ratio for the conventional non-volatile semiconductor memory device. The ratio is called an aspect ratio. In the concrete, after the etching-back of the embedded layer 3, a width (w) at the bottom of the groove 10 is adjusted to be at most twice larger than a distance (t) between the lowest level of the surface of the embedded layer 3 in the groove 10 and each end of the bottom of the groove 10, as shown in FIG. 1(B).

Figure 7I:
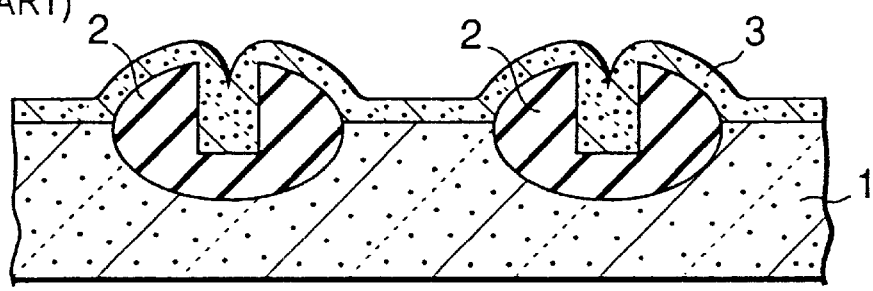
FIG. 7 schematically shows a cross sectional view along a line X-Y in FIG. 6.
Figure 7:
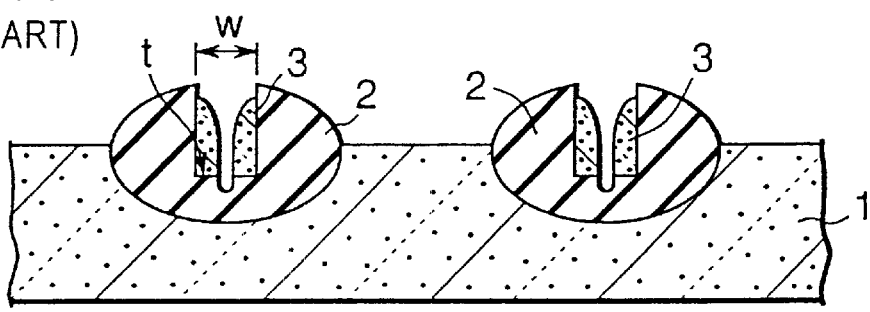

In the conventional non-volatile semiconductor memory device, as shown in FIG. 7(ii) and as mentioned above, it has been known that since the width (w) at the bottom of the groove 10 was above twice larger than the thickness (t) of the embedded layer 3 (i.e. since the thickness of the embedded layer 3 from the inwall of the groove was thinner than the width w), it would exhibit the poor resistance to etching. Therefore, after the etching of the embedded layer 3, it did not remain at the bottom and on the surface of the groove almost or at all, and defects 20 were optionally generated on the surface of the substrate 1.

For the non-volatile semiconductor memory device of the present invention, the resistance to etching of the embedded layer in the etching step may be improved comparing with the conventional non-volatile semiconductor memory device by decreasing the aspect ratio, i.e. by increasing the thickness of the embedded layer 3 and preventing the bottom of the groove 10 from exposing. As the result, the electric resistance at a source area may be lowered. Thereby, the margin of implanted ion passing through the electrode may be enhanced, and excellent covering power (the surface smoothness) of the embedded layer 3 in and above the groove 10 within a field oxide region 2 may be also provided at any one of the electrode region, the memory cell area and the source area.

Embodiments 2 and 3

In the non-volatile semiconductor memory device of the present invention, the embedded layer 3 is preferably formed so as to perfectly embed the groove 10 within the field oxide region 2, wherein the width (w) at the bottom of the groove is at most twice larger than the distance (t) between the lowest level of the surface of the embedded layer in the groove and each end of the bottom of the groove, as shown in FIG. 1(B).

Figure 2I:
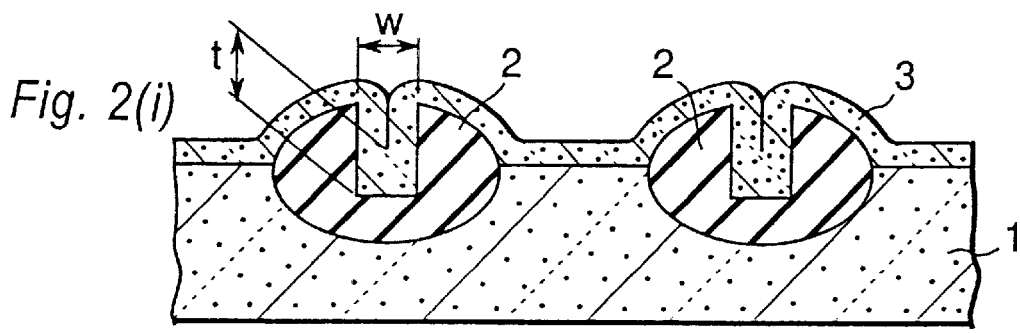
FIG. 2 schematically shows a process flowchart, illustrating Embodiment 2 of the non-volatile semiconductor memory device of the present invention. Each FIG. (i), (ii) or (iii) corresponds to a cross sectional view along a line A-B in FIG. 1(A).
Figure 2:
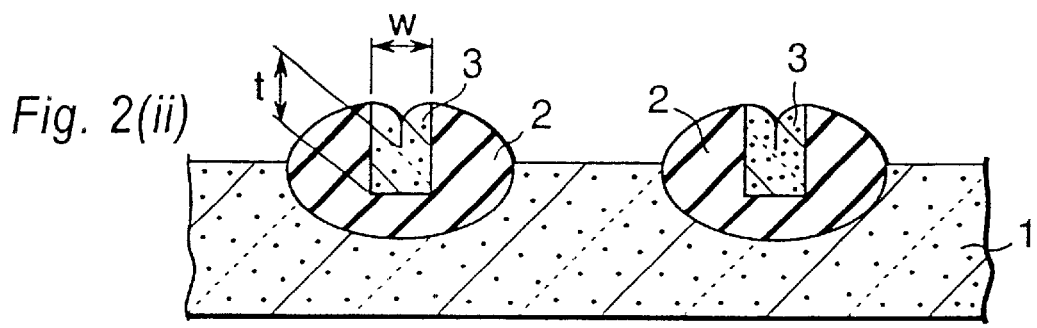

Accordingly, in the non-volatile semiconductor memory device of the present invention, the embedded layer 3 may cover an upper surface of the field oxide region 2 (Embodiment 2; as shown in FIG. 2 (i)), or it may be deposited up to the same level as the top of the inwall of the groove 10 after the etching-back (Embodiment 3; as shown in FIG. 2(ii)). By forming the embedded layer in either form, an etching rate for removing the residual field oxide region in the subsequent step may be readily controlled. Thereby, both the field oxide region and the embedded layer may be perfectly removed without damaging the semiconductor substrate (as shown in FIG. 2(iii)).

Embodiment 4

In the non-volatile semiconductor memory device of the present invention, the embedded layer deposited in the groove may be preferably in a form of bulk, but may have some voids therein. Even if some voids are present in the embedded layer, they do not adversely affect the subsequent ion-implanting step and the resistance to etching, as well as the covering power (the surface smoothness) of the interlayer further deposited over the embedded layer and the like.

However, the embedded layer is most preferably deposited in a form of bulk.

Embodiment 5

Figure 3:
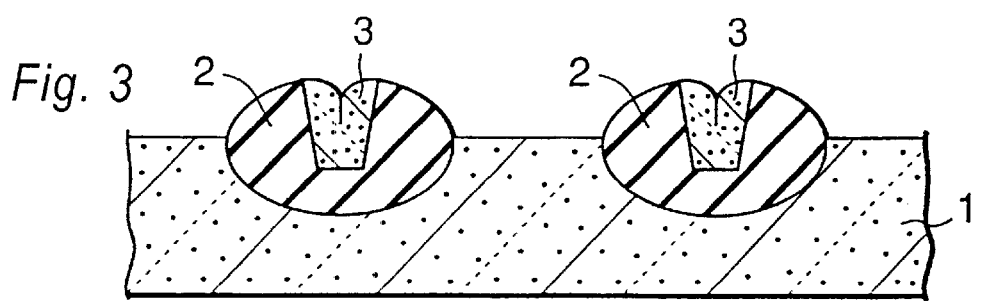
FIG. 3 schematically shows a cross sectional view along a line A-B in FIG. 1(A), illustrating Embodiment 5 of the non-volatile semiconductor memory device according to the present invention.

In the present invention, the inwall of the groove formed in the field oxide region may be perpendicular to the bottom of the semiconductor substrate. More preferably, the inwall of the groove may tilt so as to have a wider width between the upper ends than one between the lower ends, as shown in FIG. 3. The tilted inwall makes the embedment of the embedded layer into the groove easier, and thereby, it may enhance the covering power of the embedded layer. The tilted inwall becomes particularly effective when both the field oxide region and the embedded layer are not subjected to etching to remove them and remain as they are, followed by covering with the interlayer, for example, at the area or region with the exception of the electrode region.

Embodiment 6

A suitable material used for forming the embedded layer in the non-volatile semiconductor memory device of the present invention may be selected form the group consisting of high density plasma CVD film (HDP), both boron and phosphorous-doped tetraethyl orthosilicate (BPTEOS), boron-doped tetraethyl orthosilicate (BTEOS) and phosphorous-doped tetraethyl orthosilicate (PTEOS).

Any of the above materials may provide more excellent covering power which has not been achieved with the conventional material such as tetraethylorthosilicate (TEOS). Therefore, the covering power (the surface smoothness) of the interlayer further covering the embedded layer after the embedded layer is deposited in a trench structure and the like may be also improved.

Otherwise, forming the electrode using the above material may decrease an amount of the implanted ion passing through the electrode.

Method for Manufacturing the Non-volatile Semiconductor Memory Device

The present invention further provides the method for manufacturing the non-volatile semiconductor memory device, wherein the recess pattern is formed on the surface of the semiconductor substrate to form the field oxide region in the recess pattern, the first insulator layer and the floating gate-electrode layer are deposited on the surface of the semiconductor substrate and etching them to form the floating gate, and the second insulator layer and the control gate-electrode layer are deposited over the whole surface of the semiconductor substrate and etching them to form the control gate, followed by removing the residual floating gate-electrode layer on the electrode region to form the groove in the field oxide region. Then, the embedded layer is deposited over the whole surface of the semiconductor substrate, including the groove, and then both the embedded layer and the field oxide region are etched back so as to be a width (w) at the bottom of the groove at most twice larger than a distance (t) between the lowest level of the surface of the embedded layer in the groove and each end of the bottom of the groove. The method of the present invention is characterized by that the step of etching a memory cell in a cell array region is conducted apart from the process for a peripheral circuit region distributed around the cell array region, where does not essentially need the etching step.

According to the method of the present, the cell array region (particularly the memory cell area) and the peripheral circuit region distributed around the cell array region may be separately subjected to etching.

In the method of the present invention, the steps of forming the field oxide region, forming the groove in the field oxide region and depositing the embedded layer in the groove may be performed according to the conventional method explained hereinbefore.

In the present invention, the material used for forming the embedded layer may be most preferably selected from the group consisting of HDP, BPTEOS, PTEOS and BTEOS mentioned above.

In the present invention, the step of etching, if necessary, may be conducted simultaneously with or after the step of ion implanting. Thereby, since the memory area which does not need the step of ion implanting and the peripheral circuit region which essentially needs the step may be separately processed, the desired voltage proof at each area or region which has a different amount of implanted ion may be more easily controlled. However, the ion implanting step at the same time of or after the etching is of course unnecessary in case when or at a part which the ion implanting is conducted before the deposition of the embedded layer.

According to the method of the present invention, the etching amount (that is an etching depth) necessary for each area or region may be more easily controlled so that the margin referring to the etching rate may be enhanced.

According to the method of the present invention, the area or region where essentially needs the etching step may be processed apart from one where does not need the etching step (for example, the source area in which the interlayer is deposited over the embedded layer remaining in the groove as it is). Thereby, since an especial part such as a mask and the like is unnecessary for the sake of the protection of the area or region where does not need the etching step, the productive efficiency may be enhanced.

EXAMPLES

The following Example further illustrates the present invention in detail but are not to be construed to limit the scope thereof to its details.

Example 1

Figure 4:
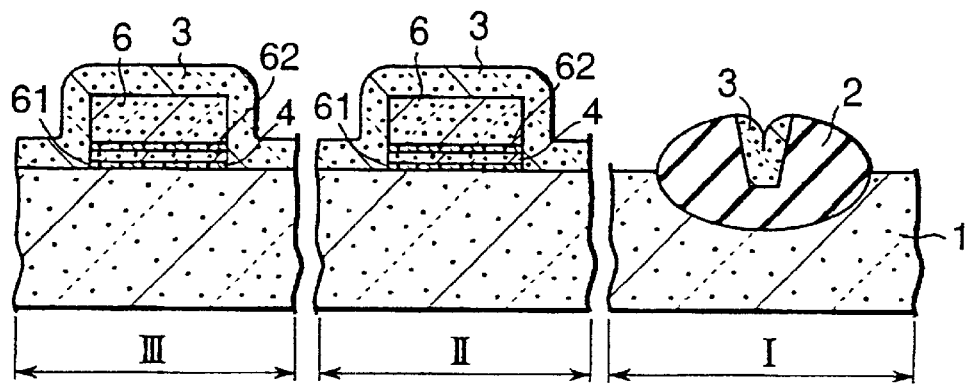
FIG. 4 schematically shows a process flowchart illustrating characteristic steps in the method for producing the non-volatile semiconductor memory device of the present invention obtained in Example 1.
Figure 4:
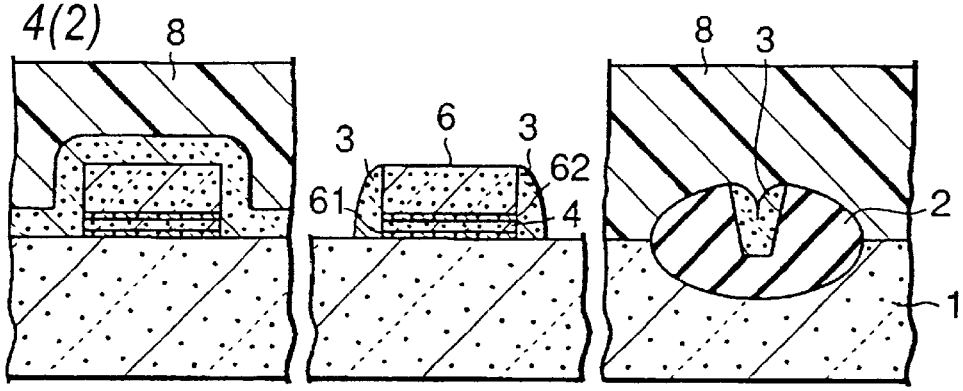
Figure 4:
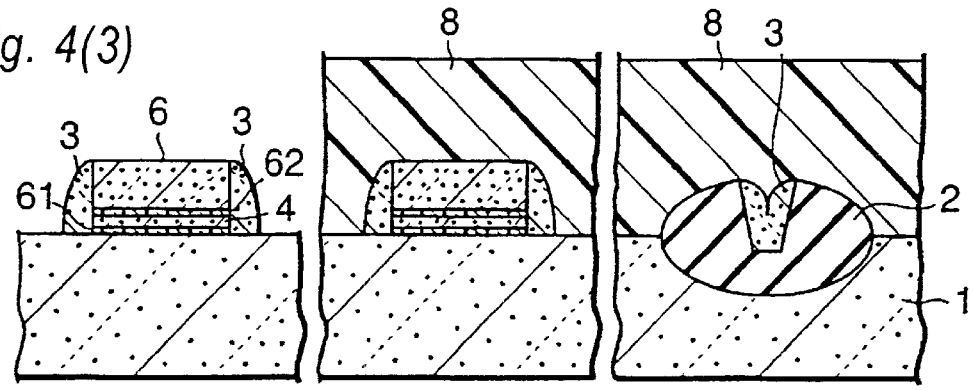

FIG. 4 shows a process flowchart including steps of depositing an embedded layer on a field oxide layer formed at a memory cell area (I), and a N-channel area (II) and a P-channel area (III) distributed in a peripheral circuit region around the memory cell area (I), and then, separately etching to form electrodes at the N-channel area and the P-channel area, respectively.

First, the field oxide layer 2 is deposited into the recess pattern formed in the semiconductor substrate 1 according to the conventional method as explained above. The first insulating layer 61 and the floating-gate electrode layer 4 are deposited on the field oxide layer 2 and etched them to form the floating gate, and then depositing the second insulating layer 62 and the control-gate electrode layer 6 and etching them to form the control gate. During the above process, the groove 10 is formed in the field oxide layer 2.

The embedded layer 3 is then deposited on the whole surface of the substrate 1, including the groove 10, as shown in FIG. 4 (1), and then subjected to etching back. The embedded layer 3 over the whole surface of the substrate 1 is etched back at the same time and to the extent of preventing each electrode 7 from exposing, wherein the electrode 7 has been preliminarily formed in the field oxide region 2 at both the N-channel area and the P-channel area.

Then, as shown in FIG. 4 (2), after the memory cell area (I) and the P-channel area (III) are covered with a resist layer 8, respectively, the embedded layer 3 deposited over the N-channel area (II) is etched back, followed by ion implanting. After the ion implanting, only the N-channel area (II) is covered with the resist layer 8. Then, only the embedded layer 3 on the P-channel area (III) is etched back and ion implanted, as shown in FIG. 4 (3).

The etching back of the embedded layer 3 deposited over the memory cell area (I) is performed apart from the etching thereof at the N-channel area (II) and the P-channel area (III) to provide the embedded layer 3 with the surface smoothness. However, since the subsequent steps of etching and ion implanting are not performed because of unnecessary (FIG. 4 (1) to (3)).

In Example 1 according to the method of the present invention, the electrode region where needs both the ion implanting and etching may be processed apart from the memory cell area where does not need the steps. At the result, the thickness of the field oxide region remaining above the memory cell area after the etching surely increases, as well as the desired voltage proof at each area or region may be more easily controlled.

EFFECTS OF THE INVENTION

The non-volatile semiconductor memory device of the present invention may possess the enhanced margin of implanted ion passing through a source-to-drain electrode, as well as the excellent surface smoothness of the embedded layer deposited in and above the groove within the field oxide region distributed at both the source-to-drain electrode and the source area, by defining the thickness (t) of the embedded layer from the inwall of the groove based on the width (w) at the bottom of the groove. By tilting the inwall of the groove, the surface smoothness of the embedded layer and the covering power (that is the surface smoothness) of the interlayer may be more effectively improved.

In the present invention, the material having the excellent covering power (the surface smoothness), which is preferably selected from a group consisting of HDP, BPTEOS, PTEOS and BTEOS, may be employed to form the embedded layer, instead of using TEOS conventionally used in the art. Thereby, the interlayer further deposited over the embedded layer may have more excellent coverage power. In the step of forming the electrode region, it is also possible to decrease an amount of implanted ion passing through the electrode region.

According to the method for manufacturing a non-volatile semiconductor memory device of the present invention, the desired voltage proof at each area or region which has a different amount of implanted ion passing therethrough may be more easily controlled, as well as the margin referring to the etching rate may be further enhanced. Since the area or the region where needs the subsequent etching step may be processed apart from the other one where does not need the etching step, a particular mask used for protecting the latter area or region is unnecessary and thereby, the productive efficiency may be enhanced.

What is claimed is:

1. A non-volatile semiconductor memory device, comprising:
   a semiconductor substrate having a recess pattern on a surface thereof,
   a field oxide region formed in the recess pattern, and
   on the surface on the semiconductor substrate, a gate-electrode structure comprising a first insulator layer, a floating gate-electrode layer, a second insulating layer and a control gate-electrode layer which are deposited after the formation of the field oxide region,
   wherein an embedded layer is deposited over the whole surface of the gate-electrode structure including the control gate-electrode layer, and the embedded layer is embedded in a groove formed within the field oxide region, characterized by that a width (w) at a bottom of the groove is adjusted to be at most twice larger than a distance (t) between the lowest level of the surface of the embedded layer in the groove and each end of the bottom of the groove.

2. The non-volatile semiconductor memory device according to claim 1, wherein the embedded layer is deposited in and above the groove, including a top of an inwall thereof.

3. The non-volatile semiconductor memory device according to claim 1, wherein the embedded layer is deposited up to the same level as a top of the inwall of the groove.

4. The non-volatile semiconductor memory device according to claim 1, wherein the inwall of the groove tilts so as to have a wider width between the top of the inwall of the groove than the width of the bottom of the groove.

5. The non-volatile semiconductor memory device according to claim 1, wherein a material for forming the embedded layer is selected from the group consisting of high density plasma CVD film, both boron and phosphorous-doped tetraethyl orthosilicate, boron-doped tetraethyl orthosilicate and phosphorous-doped tetraethyl orthosilicate.

6. A method for manufacturing the non-volatile semiconductor memory device according to claim 1, comprising steps of:

providing a recess pattern on a surface of a semiconductor substrate to form a field oxide region in the recess pattern, depositing a first insulator layer and a floating gate-electrode layer on the surface of a semiconductor substrate and etching them to form a floating gate, depositing a second insulator layer and a control gate-electrode layer over the whole surface of the semiconductor substrate and etching them to form a control gate, and then removing the residual floating gate-electrode layer on an electrode region to form a groove in the field oxide region, further comprising a step of depositing an embedded layer over the whole surface of the semiconductor substrate, including the groove, followed by etching back to be a width (w) at the bottom of the groove at most twice larger than a distance (t) between the lowest level of the surface of the embedded layer in the groove and each end of the bottom of the groove, characterized by that the step of etching a memory cell in a cell array region is conducted apart from the process for a peripheral circuit region distributed around the cell array region, where does not essentially need the etching step.

* * * * *